United States Patent [19]
Choi et al.

[11] Patent Number: 5,677,569
[45] Date of Patent: Oct. 14, 1997

[54] SEMICONDUCTOR MULTI-PACKAGE STACK

[75] Inventors: Ki Won Choi, Kyungki-do; Seung Kon Mok, Seoul; Seung Ho Ahn, Suwon-city, all of Rep. of Korea

[73] Assignee: Samsung Electronics Co., Ltd., Suwon-city, Rep. of Korea

[21] Appl. No.: 549,522

[22] Filed: Oct. 27, 1995

[30] Foreign Application Priority Data

Oct. 27, 1994 [KR] Rep. of Korea ............... 27616

[51] Int. Cl.⁶ .................. H01L 23/48; H01L 23/54
[52] U.S. Cl. ............. 257/686; 257/723; 257/725; 257/777; 257/733
[58] Field of Search ................ 257/686, 777, 257/778, 723, 725, 733

[56] References Cited

U.S. PATENT DOCUMENTS

| | | | |
|---|---|---|---|
| 4,996,583 | 2/1991 | Hatada | 257/686 |
| 4,996,587 | 2/1991 | Hinrichsmeyer et al. | 257/686 |
| 5,101,324 | 3/1992 | Sato | 257/723 |
| 5,104,820 | 4/1992 | Go et al. | 437/51 |
| 5,241,454 | 8/1993 | Ameen et al. | 257/686 |
| 5,299,092 | 3/1994 | Yaguchi et al. | 257/686 |
| 5,332,922 | 7/1994 | Oguchi et al. | 257/723 |
| 5,408,123 | 4/1995 | Murai | 257/777 |
| 5,473,188 | 12/1995 | Ando | 257/723 |
| 5,539,250 | 7/1996 | Kitano et al. | 257/723 |
| 5,563,773 | 10/1996 | Katsumuta | 257/723 |

FOREIGN PATENT DOCUMENTS

| | | | |
|---|---|---|---|
| 0084740 | 3/1989 | Japan | 257/723 |
| 0283606 | 10/1993 | Japan | 257/723 |
| 0343608 | 12/1993 | Japan | 257/723 |

*Primary Examiner*—Tom Thomas
*Assistant Examiner*—Alexander Oscar Williams
*Attorney, Agent, or Firm*—Cushman & Cushman Intellectual Property

[57] ABSTRACT

A stacked semiconductor multi-package including a plurality of individual semiconductor chip packages stacked over one another. The individual packages have a substrate provided with a plurality of bonding pads, electrode pads electrically connected to the bonding pads through wires, and chips attached to upper and lower surfaces of the substrate. A paddles lead frame is provided onto which the individual packages are attached to upper and lower surfaces thereof, and variants thereof. For these packages, since individual packages are mounted on upper and lower surfaces of a single printed circuit board or lead frame, the mounting density can be significantly increased and their production can be simplified.

14 Claims, 13 Drawing Sheets

SEMICONDUCTOR MULTI-PACKAGE STACK

BACKGROUND OF THE INVENTION

1. Field of the Invention

The present invention relates generally to a stacked semiconductor package, and in particular to a high density, high performance stacked semiconductor package of which production can be simplified.

2. Description of the Prior Arts

Semiconductor chip packages have a structure, in general, that a semiconductor chip such as IC (Integrated Circuit) or LSI (Large Scale Integrated Circuit) is mounted on a die pad of a lead frame, bonding pads of the chip are connected to the corresponding inner leads of the lead frame via wires, and then the wires, leads, and chips are encapsulated with a mass of molding compound. However, such a package requires a large area of printed circuit board (PCB) to mount the chip on the PCB, which limits the mounting density.

Therefore, there have been many efforts to increase mounting density, for example by miniaturizing and/or thinning the semiconductor chip package.

Moreover, in order to further increase mounting density, surface mount technologies such as COB (Chip-on-Board), stacked three dimensional multi-chip and multi-package also have been developed.

Besides, in the case of semiconductor packages for memory devices, leads serving as I/O terminals of each semiconductor chip are interconnected in parallel to increase memory capacity. For this purpose, at least two rows of leads of a single semiconductor chip or at least two semiconductor chips are stacked over one another, which are then encapsulated with a molding compound.

FIG. 1 is a fragmentary perspective view of one example of conventional stacked multichip packages, which is disclosed in the U.S. Pat. No. 4,996,583.

Stacked package (10) has a structure that four semiconductor chips (16) for memory devices are stacked over one another on a printed circuit board (14) formed with metal wiring (not shown) and a land pattern (12), and that insulating layers (18) are interposed between the chips (16). Electrode pads (17) of each chip, which function as power, signal or address lines, are commonly connected to a single land pattern (12) by way of thin layer leads (11), and electrode pads (17a) which function as data lines are connected to corresponding land patterns (12a) by way of chip selection leads (11a).

This stacked package has advantages that memory capacity and signal processing speed can efficiently be increased since a plurality of functioanaly identical semiconductor chips are stacked. Moreover, mounting density Can be increased due to reduction of mounting area.

However, since thin layer leads for connecting the individual chips to a single substrate should be manufactured separately, the manufacture of the package is time-consuming and costly. Further, since it is difficult to manufacture and connect the chip selection leads (11a), it is difficult to stack more than 4 chips together into a package, and a defective chip cannot be replaced with an acceptable one, once it is connected to the substrate.

As a solution to the problems associated with this package, the U.S. Pat. No. 4,996,587 discloses an another stacked package as shown in FIG. 2.

With now reference with FIG. 2, individual semiconductor chips (26) for memory devices are attached beneath individual carriers (24), formed with a rectangular slot (23), by way of adhesive (30), and electrode pads (not shown) of the chip (26) are electrically connected to corresponding inner pads (22a) on upper surfaces of the carriers (24) through wires (25). And outer pads (22b) on upper surfaces of the carriers (24) are electrically connected to the inner pads (22a) through metal wires (not shown). Further, S-shaped clips (29) are provided at sides of the carriers (24), these clips (29) being bonded to outer pads (22b) by way of bumps (27) at their upper ends. Molding compound (28) encapsulates wires (25) of the individual packages.

For the stacked package (20) shown in FIG. 2, the carriers (24) of upper and lower packages are interconnected to each other through bumps (27) which are bonded to clips (29) of the carriers (24). The lowest carrier has pins (21) beneath the clip (29) thereof, for connecting the entire stack to the land pattern on a printed circuit board (not shown).

For this type of the stacked package (20), there can be obtained a high density package, because the carrier (24) is thin, small and is designed so as to the chip (26) attached thereunder has an exposed lower surface, and the molding compound is also thin. Moreover, since the clips (29) of the carriers (24) are interconnected to each other by way of bumps (27), defective chips can easily be replaced and a large number of chips can be stacked together into a package.

However, this package has a drawback that its production is very expensive due to high cost and difficulty of carrier production.

FIGS. 3 through 5 show another conventional stacked multichip package, which is disclosed in the U.S. Pat. No. 5,104,820.

With reference to FIG. 3, acceptable chips (46) on a wafer (41) are formed with metal wiring (45), which is electrically connected to corresponding electrode pads (47), by metallization on the upper surface of the wafer (41). One end of metal wiring (45), which is arranged in a unitary direction, is extended to neighboring chips (46). After the wafer (41) is divided into individual chips each (46) containing the extended metal wiring (45), the acceptable individual chips (46) are stacked over one another via insulating adhesives (48) so that the metal wiring of all the chips uniformly face toward the same direction.

With now reference to FIG. 5, the extended metal wirings (not shown) of the package (40) are attached via bumps (not shown) to a printed circuit board (44) formed with metal wiring (42), and land patterns (not shown) electrically connected to the metal wiring (42).

Accordingly, this stacked package (40) can have a highly dense structure in which acceptable chips (46) formed with metal wirings (45) are stacked each against another by way of adhesive.

However, because metal wires formed on a chip are extending to neighboring chips, these neighboring chips could be damaged to obtain one good chip, resulting in a decrease in an efficiency of wafer use. And, additional step for manufacturing metal wires is required. Moreover, since electrode pads of individual chips are localized to two diametrically opposite regions of the chip, an additional test apparatus for electrically testing the chip is required, and screening of acceptable die is difficult.

FIG. 6 shows a I/O pin arrangement of 35 pin SOJ (Small OutLine J-form) package of semiconductor devices for 64M DRAM (Dynamic Random Access Memory) devices. With reference to FIG. 6, one DRAM package (60) includes 10 address pins (A0–A9), nine data pins (D1–D9), nine output pins (O1–O9), row address strobe bar signal apply pin (RAS), column address strobe bar signal apply pin (CAS), write bar signal apply pin (W) , power apply pin (Vss), (Vcc), and non-connected pins (NC).

FIG. 7 is a perspective view of three dimensional stacked SOJ package of FIG. 6. With now reference to FIG. 7, the stacked multi-package SIMM (Single In-Line Memory Module; product of RTB'S), of which each package has the I/O pin arrangement shown in FIG. 6, has a plurality of individual packages stacked over one another between upper (73) and lower (74) plates. Corresponding outer leads (72) are electrically connected to and fixed to each other by vertical connector pins (75) which pass through a pin hole of the upper plate (73), pin holes formed on outer leads (72) extending from both sides of package body (71), and then a pin hole of the lower plate (74).

The pins (75) may be penetrated from the pin hole of the upper plate (73) to the pin hole of the lower plate (74), or vice versa.

Pins (75) are placed so that their both ends are extended from pin holes of the upper plate (73) as well as from pin holes of the lower plate (74), so that the projected ends can function as outer leads. The projected ends (76) from the lower plate (74) are bonded to the metal pattern of the printed circuit board (not shown).

This stacked package has a problem that, for fine pitch outer leads (72), very slim pins (75) are needed, which eventually makes it difficult to perform a pin-type mounting. Therefore, a discrete socket is required to contact the projected ends (76) of pins to a printed circuit board, and the outer leads (72) are not strong enough to adequately support the entire stack because they have through holes, through which the pins (75) pass.

Besides, stackings of semiconductor devices can be classified into three categories: bare chip, TAB, and thin plastic package (for example, TSOP (Thin Small Outline Package)) stacking technologies.

Among them, bare chip stacking is advantageous in that memory density can be easily increased. On the other hand, it also has some problems that the stacking of semiconductor chips is difficult and it cannot be applied to commonly employed mounting processes.

TAB stacking technology receives more attention because its process is rather simple compared to bare chip stacking, although it is inferior to bare chip stacking in terms of memory density and number of possibly stacked chips. TAB stacking technology also has problems that TAB tape is expensive and additional equipment for TAB process are needed.

For thin plastic package stacking, if individual packages to be stacked are not adequately thin, advantages of stacking the package cannot be obtained, and interconnection between the uppermost and lowest packages becomes long, resulting in a deterioration of quality of the stacked package. Further, even when individual packages are adequately thin, it is difficult to control reliability of individual packages and production is complex.

SUMMARY OF THE INVENTION

Accordingly, an object of the present invention is to provide a high density stacked semiconductor package, of which the structure and fabrication are simple and economic.

This object can be accomplished by a stacked semiconductor multi-package comprising a plurality of individual semiconductor chip packages stacked over one another, said individual packages having a substrate provided with a plurality of bonding pads, electrode pads electrically connected to the bonding pads through wires, and chips attached to upper and lower surfaces of the substrate; and a paddles lead frame, onto the upper and lower surfaces of which said individual packages are attached to its upper and lower surfaces.

Another object of the present invention is to provide a stacked semiconductor package comprising a plurality of individual semiconductor chip packages stacked over one another, these individual packages having a semiconductor chip provided with a plurality of bonding pads; a lead frame, onto which the chip is attached by adhesive, having outer leads and inner leads connected to the corresponding bonding pads on the chip; a molding compound encapsulating the chip, leads and wires; and a base lead frame having leads electrically connected to the corresponding outer leads of the individual packages.

Another object of the present invention is to provide a stacked semiconductor package comprising a plurality of individual semiconductor chip packages stacked over one another, these individual packages having a substrate provided with a plurality of bonding pads, wire bonding holes and gold-plated through holes; electrode pads electrically connected to the bonding pads by wires passing through the wire bonding holes; and chips mounted on lower surface of the substrate; and a paddles lead frame, which has inner leads and outer leads and is electrically connected to the individual packages by passing the inner leads through the plated through holes.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in more detail with reference to accompanying drawings.

Figure 1:
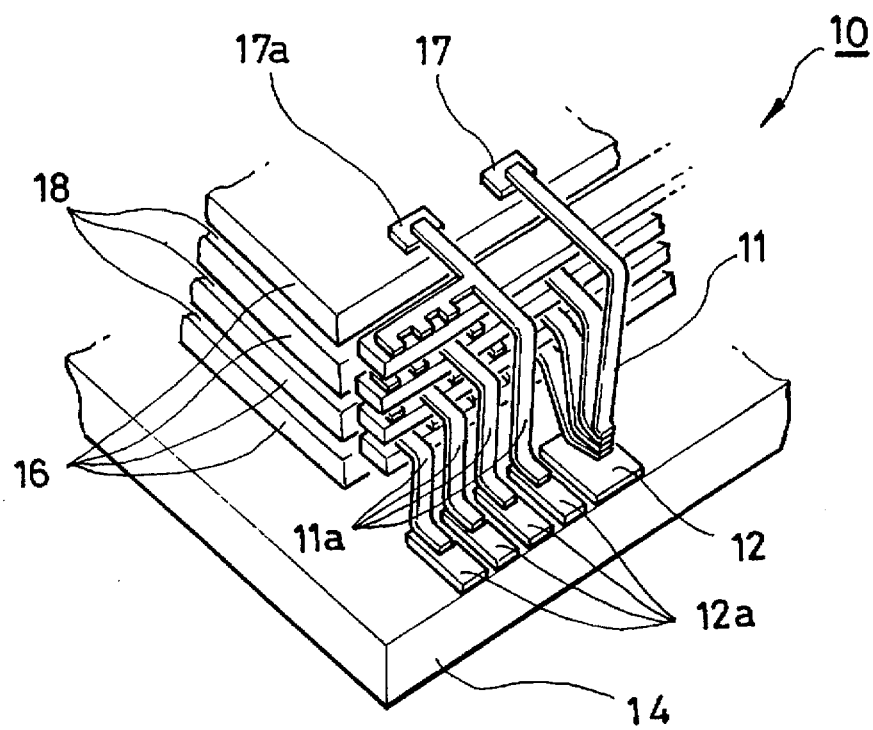
FIG. 1 is a cross-sectional perspective view of one example of conventional stacked multichip packages.
Figure 2:
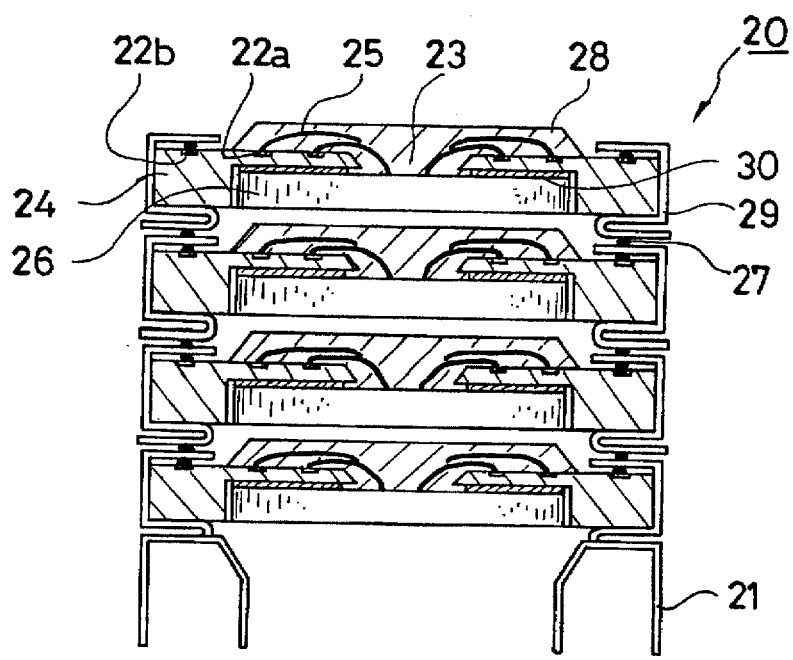
FIG. 2 is a cross-sectional perspective view of another example of conventional stacked multichip packages.
Figure 3:
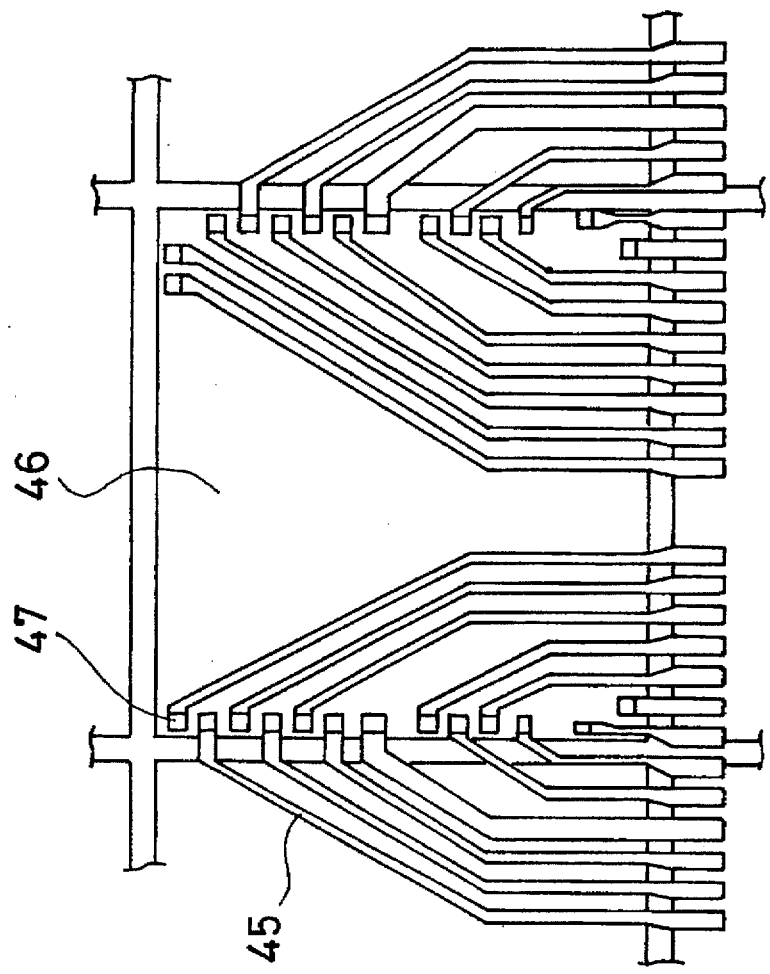
FIG. 3 is a plan view of metal wiring formed on a wafer, which will be employed in a conventional stacked multichip package.
Figure 3:
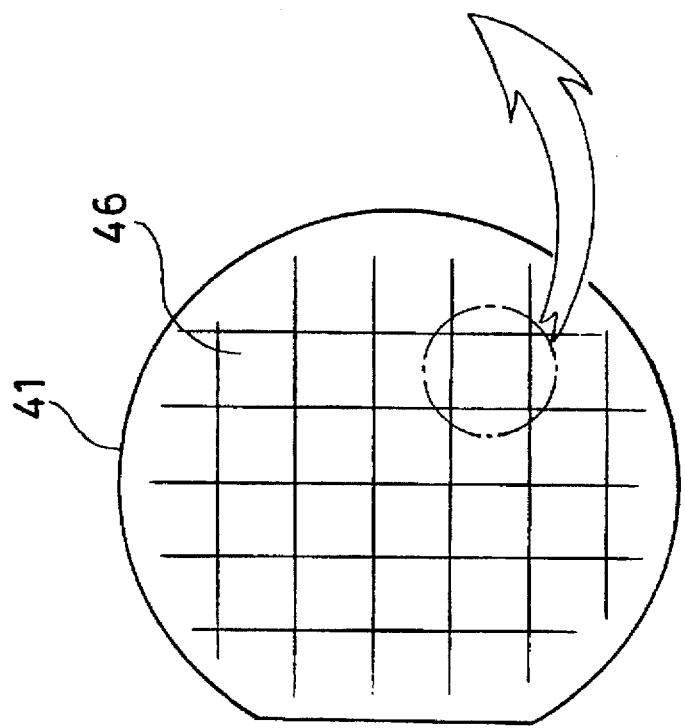
Figure 4:
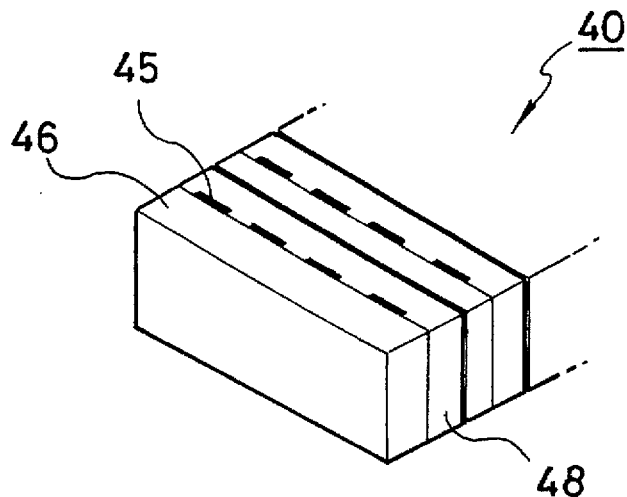
FIG. 4 is a perspective view of chips stacked over another, which are cut from the wafer of FIG. 3.
Figure 5:
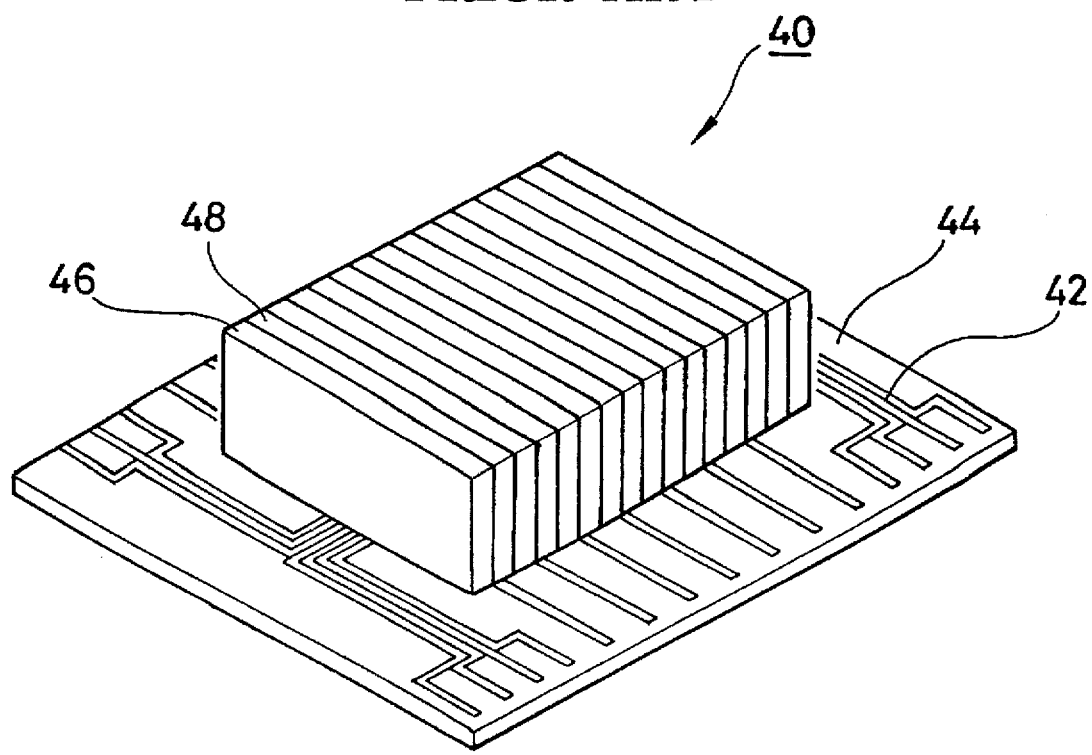
FIG. 5 is a perspective view of a stacked package, in which the stacked chips of FIG. 4 are mounted on a substrate.
Figure 6:
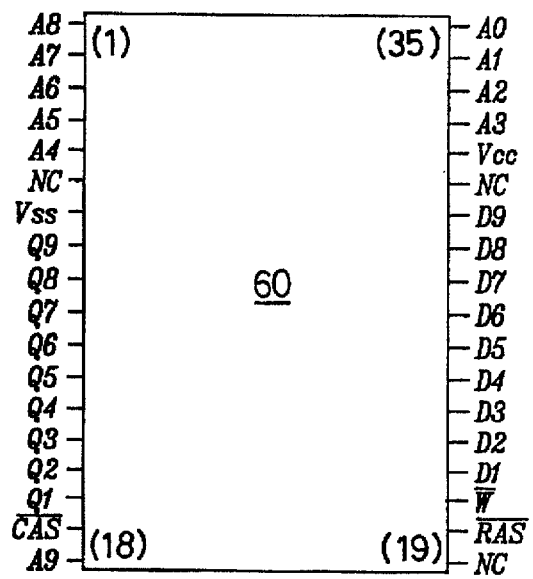
FIG. 6 shows an I/O pin arrangement of a 35 pin SOJ package of semiconductor devices for 64M DRAM devices.
Figure 7:
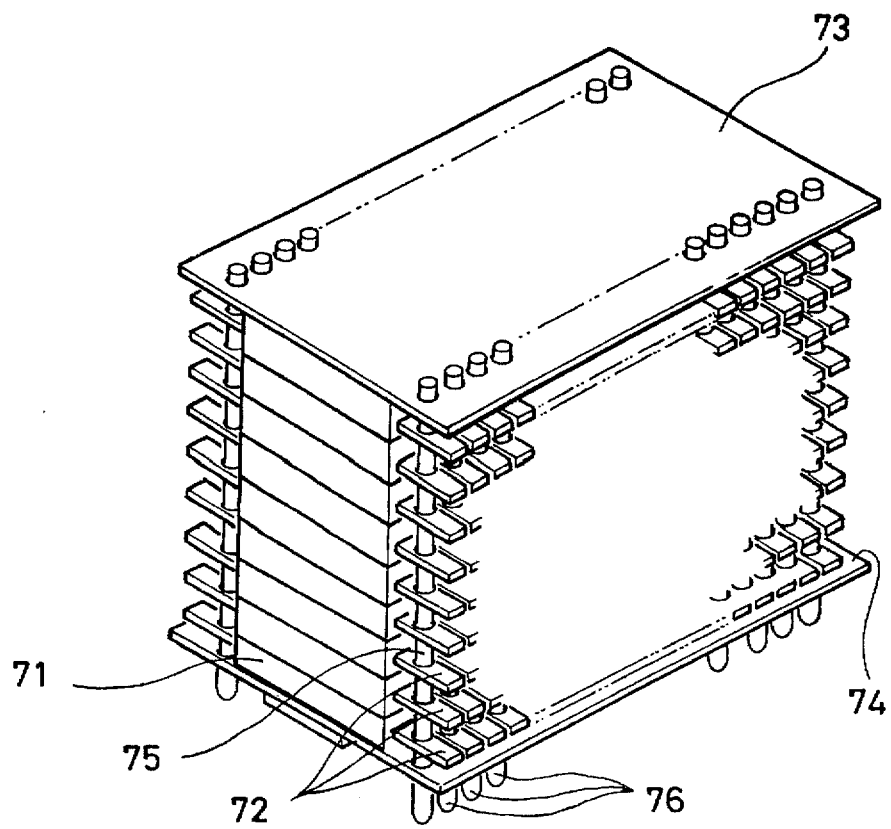
FIG. 7 is a perspective view of a three dimensional stacked SOJ package of FIG. 6.
Figure 8:
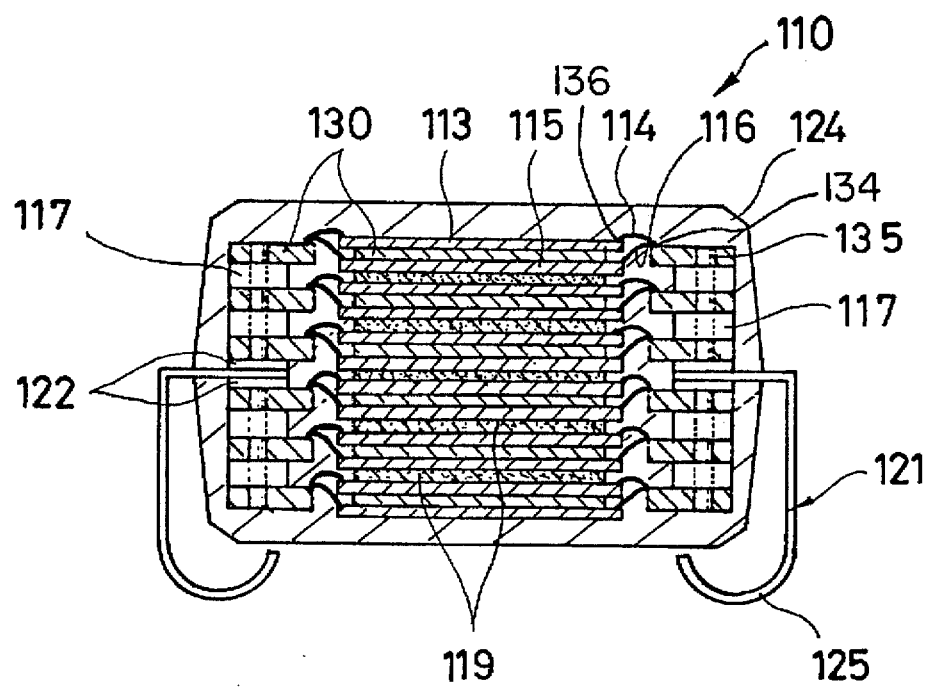
FIG. 8 is a cross-sectional view of one embodiment of a stacked multi-package according to the present invention.
Figure 9:
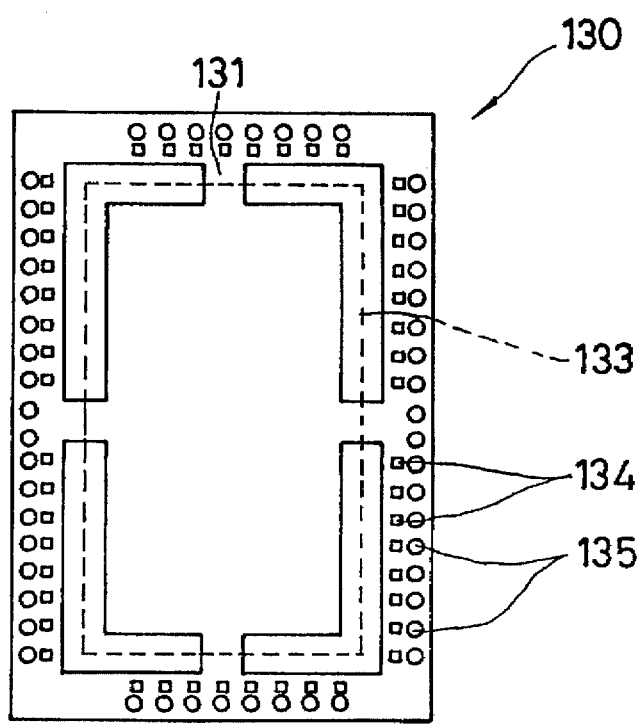
FIG. 9 is a plan view showing the structure of the substrate of the stacked multi-package of FIG. 8.

FIG. 8 is a cross-sectional view of one embodiment of a stacked multi-package according to the present invention; and FIG. 9 is a plan view showing the structure of a substrate employed in the stacked multi-package of FIG. 8;

With now reference with FIG. 9, the substrate (130) is a printed circuit board designed for dual mounting. For a simplified explanation, the upper surface of the substrate (130) will be described. The bottom surface of the substrate has the same configuration as that of its upper surface.

Substrate (130) has metal wiring (not shown) formed therein, and an area (133) for mounting a semiconductor chip is defined as indicated by a dashed line at the center of its upper surface. Bonding pads (134) are formed along the outer perimeter of the upper surface of the substrate, which are accompanied by through holes (135) located outwardly adjacent respective electrode pads (134). The internal surface of each through hole (135) is plated (not shown) in order that they can be electrically connected to metal wiring (not shown) formed within the substrate (130).

The numeral (131) indicates an injection hole for molding compound.

With now reference to FIG. 8, the first individual package has a structure that known good dies (113), (115) are attached to the mounting areas (133) of upper and lower surfaces of substrate (130) as shown in FIG. 9, respectively, and electrode pads (136) of known good dies (113), (115) are electrically connected to corresponding bonding pads (134) of substrate through wires (114), (116).

Then, two individual packages are stacked over one another and bonded together by using a nonconductive adhesive (119) in such a way that a known good die (115) on the lower surface of the upper stage individual package is bonded to a known good die (113) on the upper surface of the lower stage individual package. Two thus bonded vertically stacked individual packages are then electrically interconnected to each other through holes (135) and via bumps (117).

Further, there may be stacked another individual package on the stacked two packages in the same manner to give a multi-package.

Two thus-obtained multi-packages are bonded to the upper and bottom surfaces of inner leads of padless lead frame (121) by way of solder (122), and the stacked individual packages and circuitry on the lead frame, except outlet portions (125) of the lead frame are encapsulated (124) in a mold, forming a single package body. The outer portions of the lead frame, i.e., outer leads (125) are formed, for example J-bent in order to be adequately accommodated for mounting on a printed circuit board (not shown).

Figure 10:
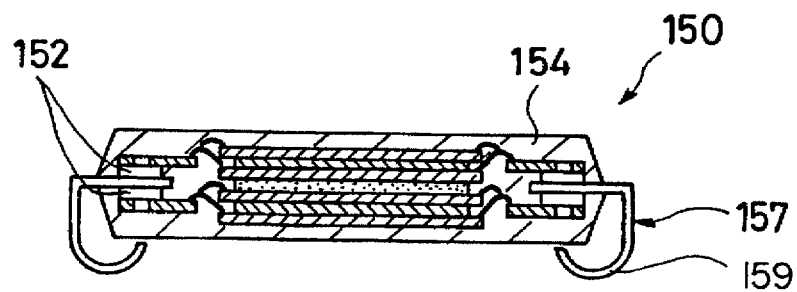
FIG. 10 is a cross-sectional view of one variant of the stacked multi-package of FIG. 8.

FIG. 10 shows a variant of the stacked multi-package of FIG. 8. With reference to FIG. 10, the stacked multi-package (150) has two individual packages stacked over one another and bonded to each other by an insulating adhesive. Each individual package is bonded to upper and lower surfaces of inner lead of paddles lead frame (157), respectively, by solder (152). Then, the entire stack except outer portions (159) of the lead frame is encapsulated in a mold, forming a single package body (154). The outer portions of the lead frame, i.e., outer leads (159) are formed, for example J-bent in order to be accommodated for mounting on a printed circuit board (not shown).

Figure 11:
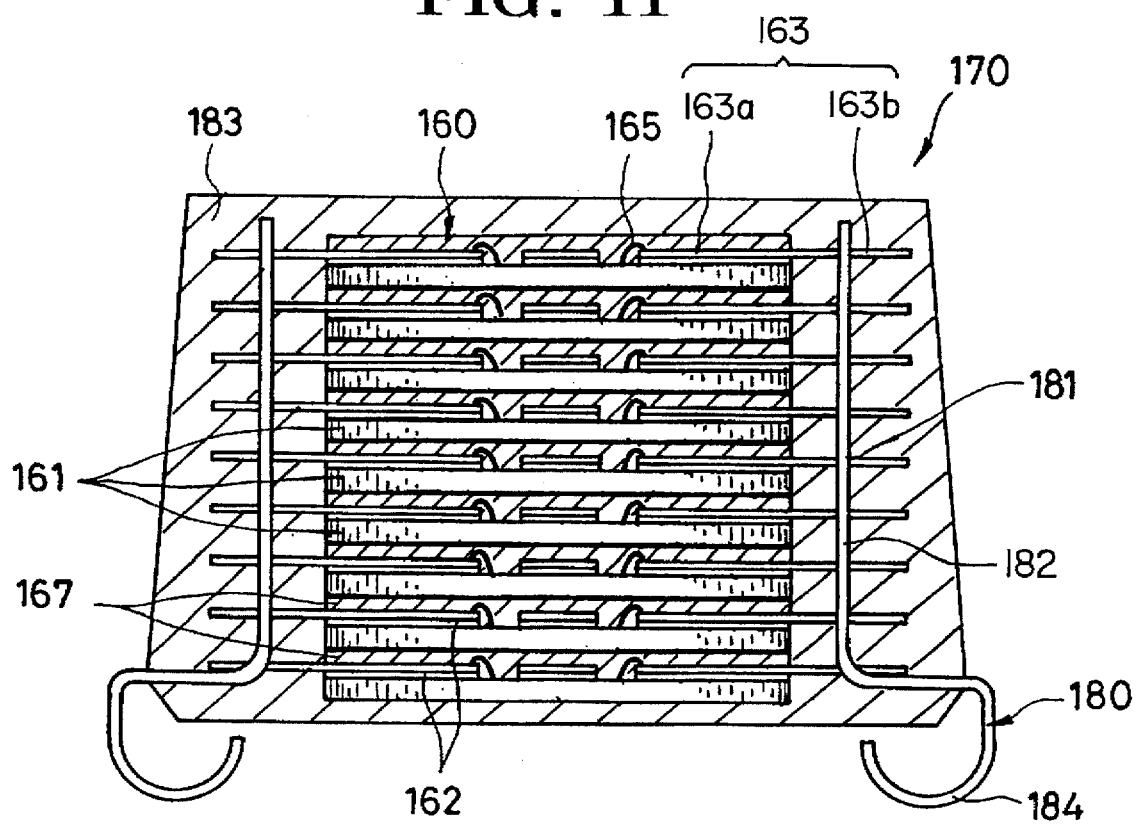
FIG. 11 is a cross-sectional view of another embodiment of a stacked multi-package according to the present invention.

FIG. 11 is a cross-sectional view of another embodiment of stacked multi-package according to the present invention. This embodiment is designed to avoid a problem associated with the stacked packages (110), (150) of FIGS. 8 and 10, that is to say, a defective chip cannot be replaced.

With reference to FIG. 11, the individual package (160) has a structure that lead frames (163) are bonded via, for example, a dual adhesive (162) to upper surface of semiconductor chip (161) except the area occupied by two rows of electrodes pads (not shown), and the electrodes pads are connected to inner leads (163a) of the lead frame (163) through wires (165). And, then wires (165), chip (161) and the inner leads (163a) of the lead frame (163) are encapsulated (167) in a mold, forming a single individual package (160). The outer portions of the lead frame, i.e., outer leads (163b) are cut to an appropriate size.

If it is required to carry out burn-in and electrical tests for the chip (161) prior to encapsulation, there may be applied various electrical signals to bonding areas (not shown) of outer leads (163b) of the lead frame (163).

A plurality of such individual packages (160) can be stacked over one another to form a single multi-package (170) on a single base lead frame (180). Thus, the individual packages (160) are aligned along with inner leads (182) of the base lead frame (180), and outer leads (163b) of lead frames (163) of the individual packages (160) are bonded by solder to joint regions (181) of inner leads of the base lead frame (180). Then the stacked individual packages (160) and the inner leads (182) of the base lead frame (180) are encapsulated (183) in a mold, forming a single stacked multi-package (170). The outer portions of the base lead frame, (180) i.e., outer leads (184) are formed, for example J-bent in order to be adequately accommodated for mounting on a printed circuit board (not shown).

Figure 16A:
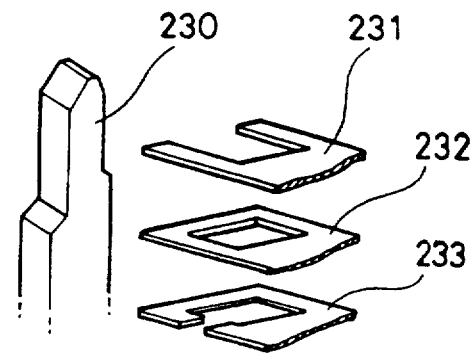
FIGS. 16(A) through 16(C) show various shapes of the connecting areas of the outer leads of the individual packages of FIGS. 11 through 15, and corresponding shapes of the inner leads of the base lead frame, which will be joined together by a solder pellet.
Figure 16B:
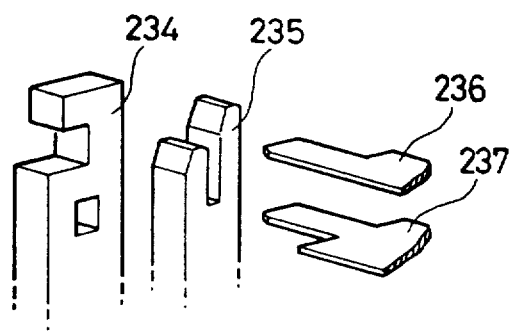
Figure 16C:
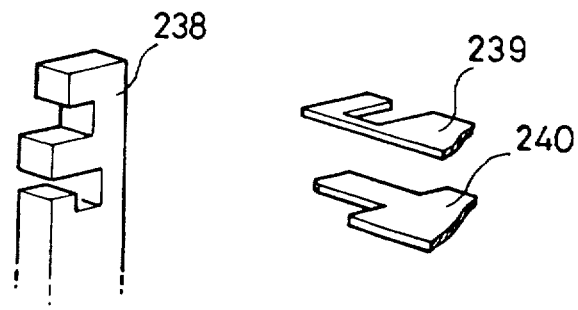

The connecting regions of outer leads (163b) of individual package (160), which will be joined by solder to joint regions (181) of inner leads (182) of the base lead frame (180), may have various shapes as shown in FIGS. 16(A) through 16(C) depending on the shape of the joint regions (181). In more detail, as shown in FIGS. 16(A) through 16(C), if the inner lead (182) of the base lead frame (180) has one of shapes (230), or (234, 235), or (238), the connecting parts of outer leads (163b) of an individual package (160) will have the shape (231, 232, or 233), or (236, or 237), or (239, or 240), respectively.

Accordingly, the individual packages (160) are stacked over one another by fitting their outer leads (163b) having one shape selected from those shown in FIGS. 16(A) through 16(C), depending on the shape of joint regions (181) of the base lead frame (180), to the joint regions (181) having a corresponding shape.

FIGS. 12 through 15 show variants of the stacked multi-package of FIG. 11.

Figure 12:
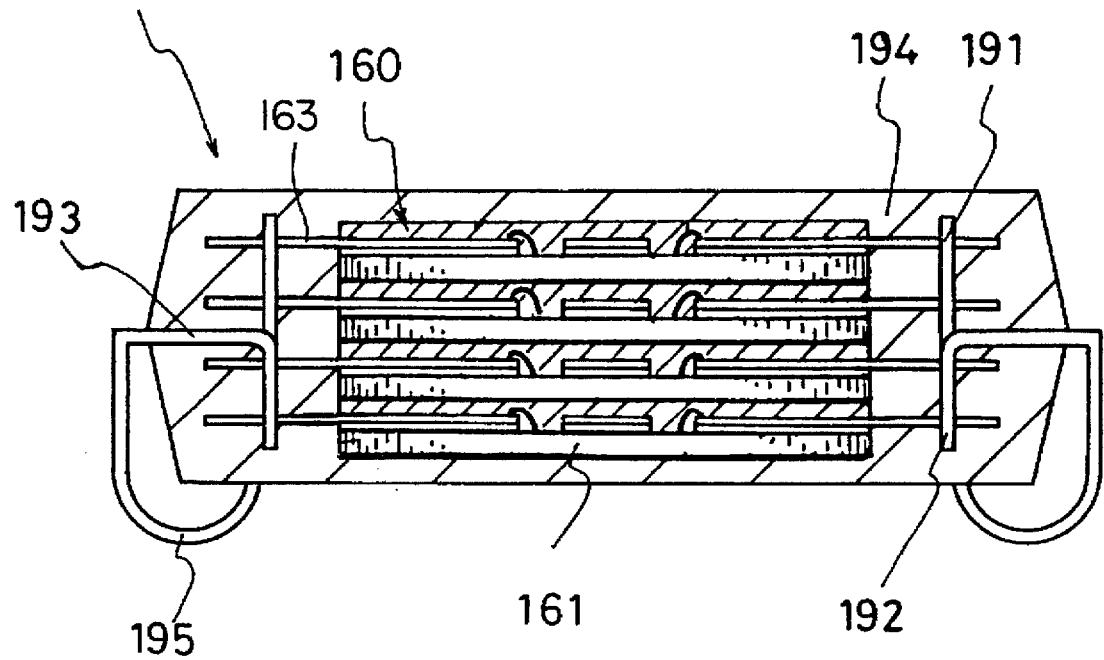
FIG. 12 is a cross-sectional view of a variant of the stacked multi-package of FIG. 11.

With reference to FIG. 12, four individual packages (160) are stacked over one another by using a base lead frame having lie-downed T-shaped inner leads, (193) which has two connecting regions (191, 192). The stacked individual packages (160) and circuitry on lead frame except outer portions (195) of the base lead frame are encapsulated (194) in a mold to form a single stacked multi-package (190). The outer portions of the lead frame, i.e., outer leads (195) are formed, for example J-bent, in order to be adequately accommodated for mounting on a printed circuit board. For the package (190), the individual packages (160) may be stacked in such a way that chips (161) of the packages (160) face upward or downward, as long as the chips of all the packages (160) face toward same direction.

Figure 17A:
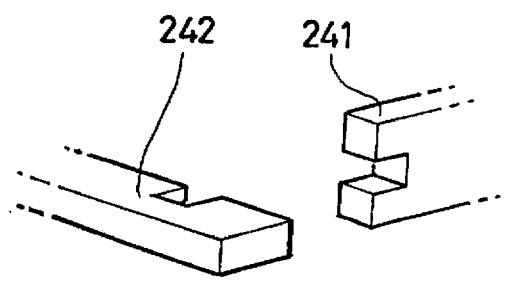
FIGS. 17(A) and 17(B) show other shapes of the outer leads and of the inner leads shown in FIGS. 16(A) through 16(C)
Figure 17B:
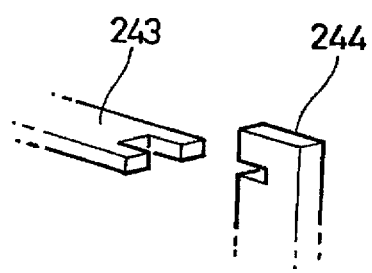

Besides, the connecting regions of lead frame (163) of individual package (160), which will be joined via solder to the jointing inner leads (191, 192) of the base lead frame, may have various shapes as shown in FIGS. 17(A) and 17(B), depending on the shape of jointing inner leads (191, 192) of the base lead frame. Thus, as shown in FIGS. 17(A) and 17(B), if the jointing inner leads (191, 192) have one of shapes (241), or (244), the connecting parts of outer leads of individual package (160) will have the shape (242), or (243), respectively.

Accordingly, the individual packages (160) are stacked over one another by fitting their lead frame (163) having one shape selected from those shown in FIGS. 17(A) and 17(B), depending on the shape of the jointing regions (191, 192) of the inner leads (193) of the base lead frame, to the jointing regions (191, 192) having a corresponding shape, and then soldering is performed.

Figure 13:
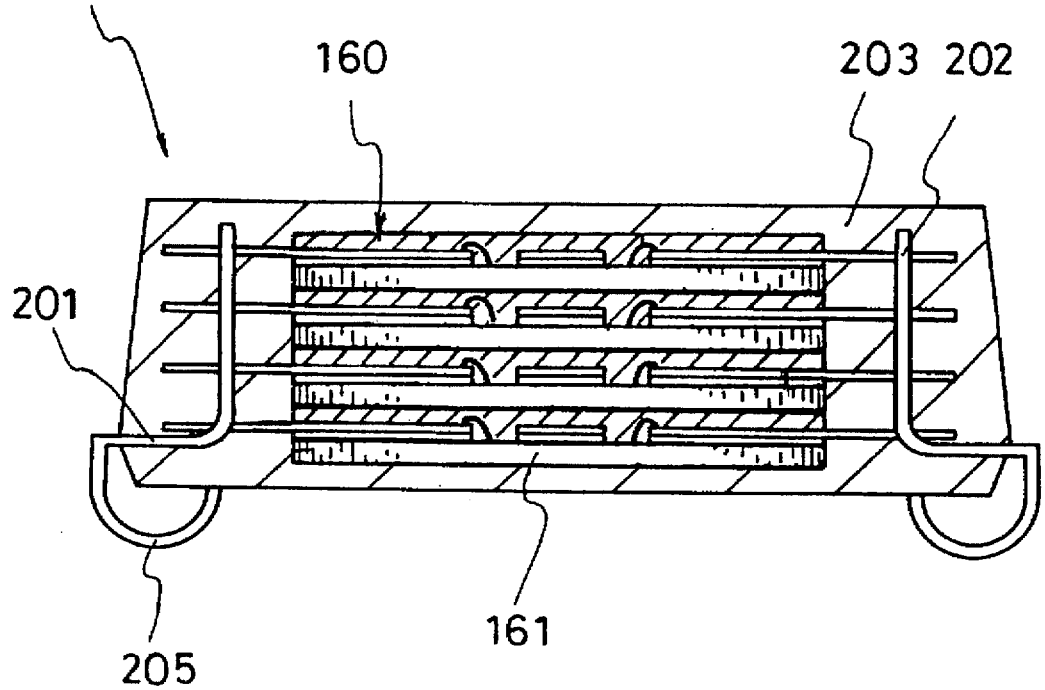
FIG. 13 is a cross-sectional view of other variant of the stacked multi-package of FIG. 11.

With reference to FIG. 13, a plurality of the individual packages (160) are stacked over one another to form a single multi-package (200) on a single base lead frame. Thus, four individual packages (160), which are same as that shown in FIG. 11, are fitted and soldered to connecting region (202) of the inner leads (201) of the base lead frame, and the entire stack, except outer portions (205) of the base lead frame are encapsulated (203) in a mold to form a single stacked multi-package (200). The outer portions of the base lead frame, i.e., outer leads (205) are formed, for example J-bent, in order to be adequately accommodated for mounting on a printed circuit board. For the entire package (200), the individual packages (160) may be stacked in such a way that chip (161) of the packages (160) face upward or downward, as long as the chips (161) of all the packages (160) face toward same direction.

Figure 14:
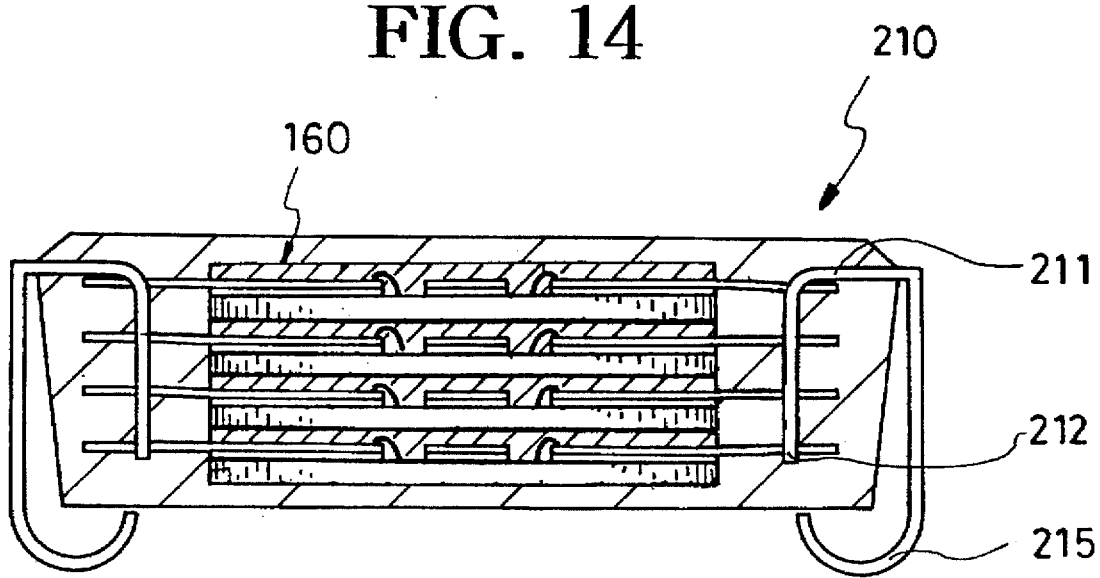
FIG. 14 is a cross-sectional view of another variant of the stacked multi-package of FIG. 11.

With reference to FIG. 14, the stacked multi-package (210) has the same structure as that of stacked multi-package (200) shown in FIG. 13, except for the shape of lead frame. The lead frame has inner leads (211) and outer leads (215) bent downwardly.

The individual packages (160) may be connected to jointing region (212) having the shape (230) shown in FIG. 16(A) by fitting the outer leads of the individual package (160) having the corresponding shape (231, 232, or 233) into the jointing region (212).

Figure 15:
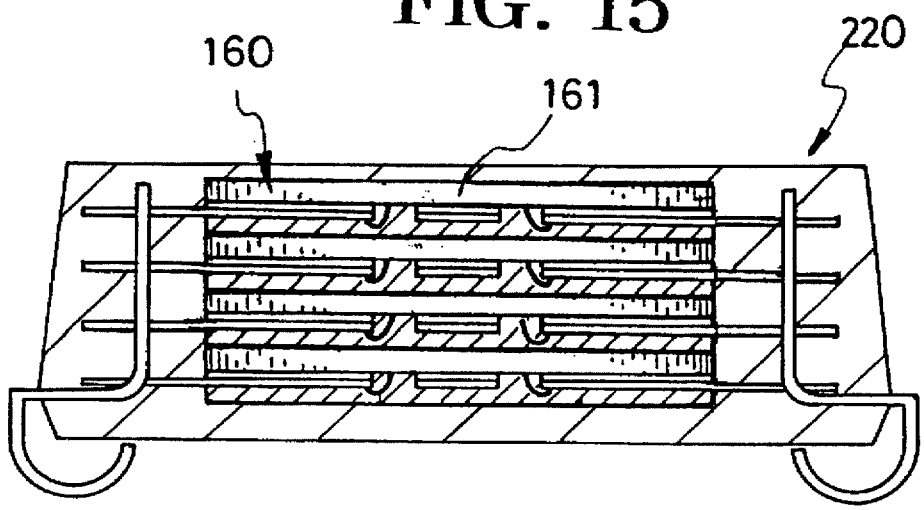
FIG. 15 is a cross-sectional view of another variant of the stacked multi-package of FIG. 11.

With reference to FIG. 15, the stacked multi-package (220) has the same structure as that of the stacked multi-package (200) shown in FIG. 13, except that the chips (161) of each individual package (160) face upward, while the chips of the package unit shown in FIG. 13 all face downward.

Figure 18:
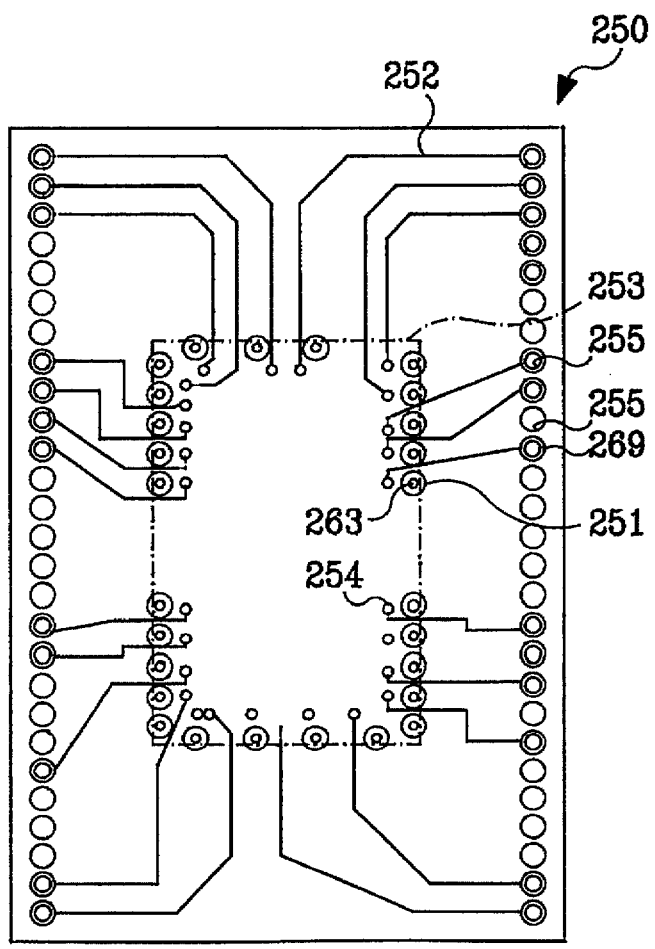
FIG. 18 is a plan view showing the substrate of the stacked multi-package according to the present invention.

FIG. 18 is a plan view of another substrate employed for the stacked multi-package according to the present invention.

With reference to FIG. 18, substrate (250) is made of ceramic or plastic material and has metal wiring (not shown) formed therein. Plated through holes (255) are formed at opposite outer perimetrical margins of the substrate (250), and an area (253) for mounting a semiconductor chip is defined as indicated by a dashed line at the center of upper surface of the substrate (250). Holes (251) and wire bonding pads (254) are formed along the mounting margins of the area (253), and the bonding pads (254) are electrically connected to corresponding through holes (255) through metal wiring (252).

Holes (251) each have a large diameter enough that capillary for wire bonding can be passed therethrough, when electrode pads (263) on chip are connected to wire bonding pads (254) by wires. Through holes (255) are plated with conductive material (269).

Figure 19:
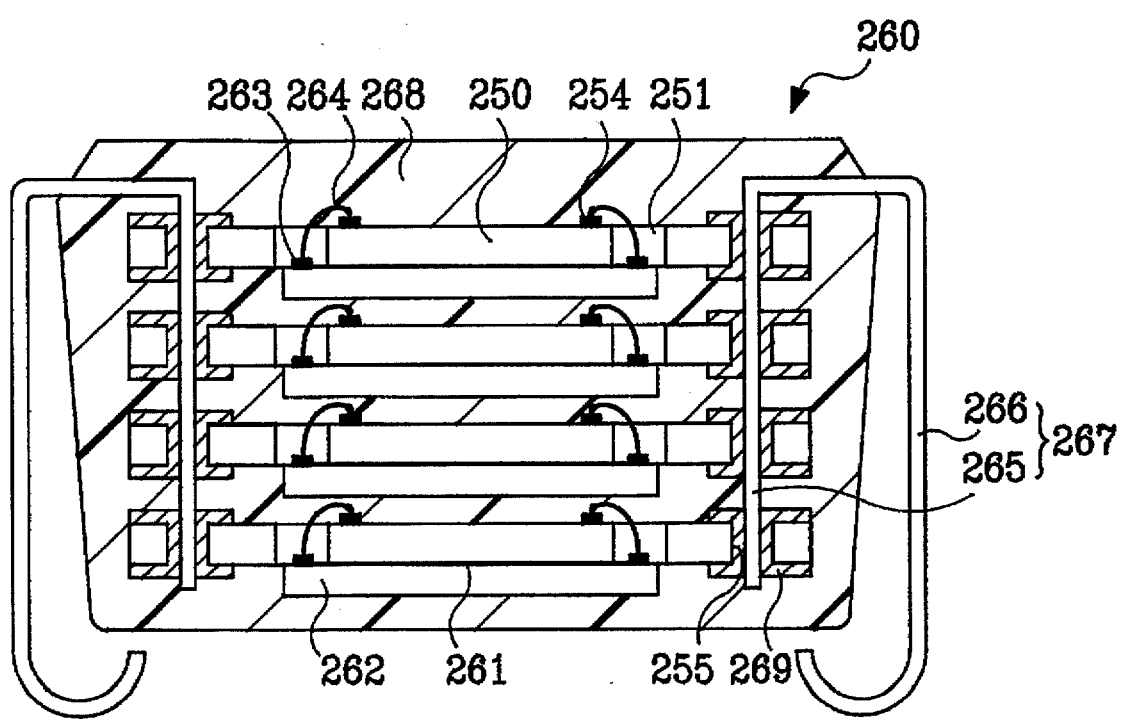
FIG. 19 is a cross-sectional view of stacked multi-package employing the substrate of FIG. 18.

FIG. 19 is a cross-sectional view of another embodiment of the stacked multi-package according to the present invention. With reference to FIG. 19, the individual package has a structure such that a semiconductor chip (262) is attached to lower surface of the substrate (250) as shown in FIG. 18 by way of an insulating adhesive, (261) in such a way that electrode pads (263) of the chip (262) can be inserted into holes (251) on the substrate (250). Further, wire bonding pads (254) of the substrate (250) are electrically connected to the electrode pads (263) by way of gold wires (264).

Four identical individual packages having the same structure as described above are stacked over one another with their chips facing downward, by passing the inner leads (265) of base lead frame (267) through the corresponding through holes (255) of the individual packages, so that corresponding through holes (255) of the individual packages can be interconnected to each other by means of the conductive material (269) in the through holes (255) and the inner leads (265) of the base lead frame (267). The upper ends of inner leads (265) are joined to outer leads (266) of base lead frame (267).

And the entire stack, except outer portions of the outer leads (266) of the base lead frame, (267) is encapsulated (268) in a mold to form a single stacked multi-package (260). The outer portions of the lead frame, i.e., outer leads (266) are formed so as to be adequately accommodated for mounting on a printed circuit board.

Figure 20:
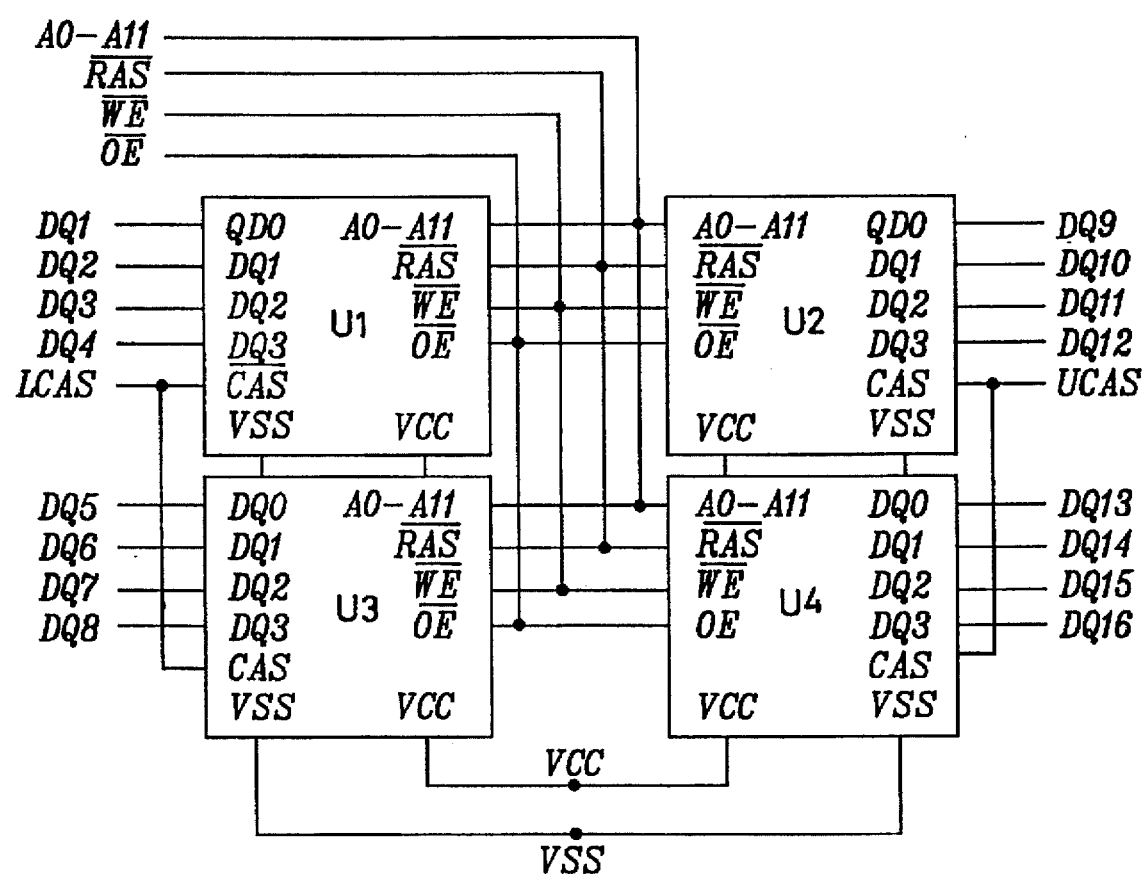
FIG. 20 is a function block diagram of the overall circuit of the stacked multi-package of FIG. 19.

FIG. 20 is a functional block diagram of the overall circuit of the stacked multi-package of FIG. 19.

With reference now to FIG. 20, when four 16M DRAM individual packages are stacked to obtain a 64M byte word wide DRAM, four 16M DRAM semiconductor devices (U1, U2, U3, U4) are interconnected to each other in parallel.

Thus, address pins (A0–A11), row address strobe bar pins (RAS), write enable bar pins (WE), out enable bar pins (OE), power supply terminals (VCC), and operation power supply terminals (VSS) are respectively connected to corresponding pins. Data (DQ1–DQ4, DQ5–DQ8, DQ9–DQ12, DQ13–DQ16) are inputted and outputted via data lines (DQ1–DQ4) of the individual semiconductor devices (U1, U2, U3, U4), respectively.

Semiconductor devices (U1, U2) are controlled by data line (LCAS), while devices (U3, U4) are controlled by data line (UCAS).

Figure 21:
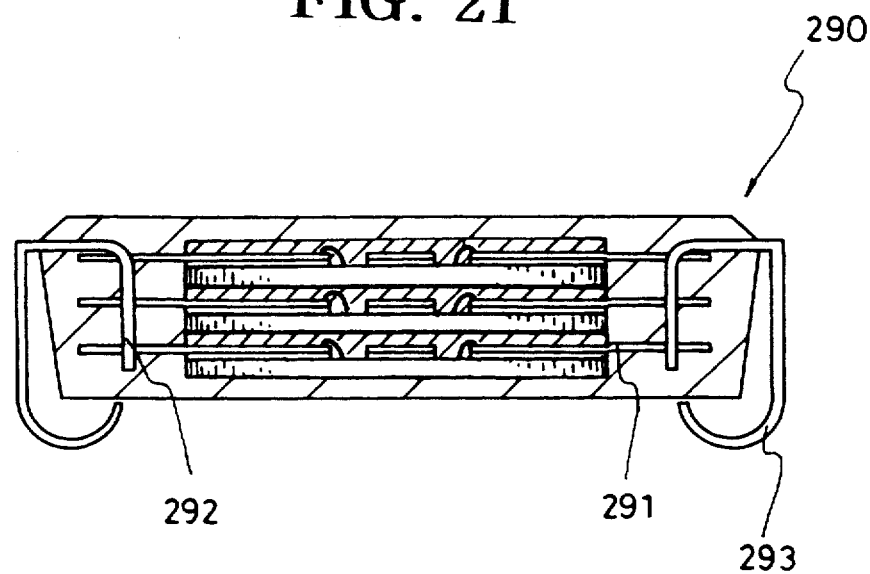
FIG. 21 is a cross-sectional view of another variant of the stacked multi-package of FIG. 19.
Figure 22:
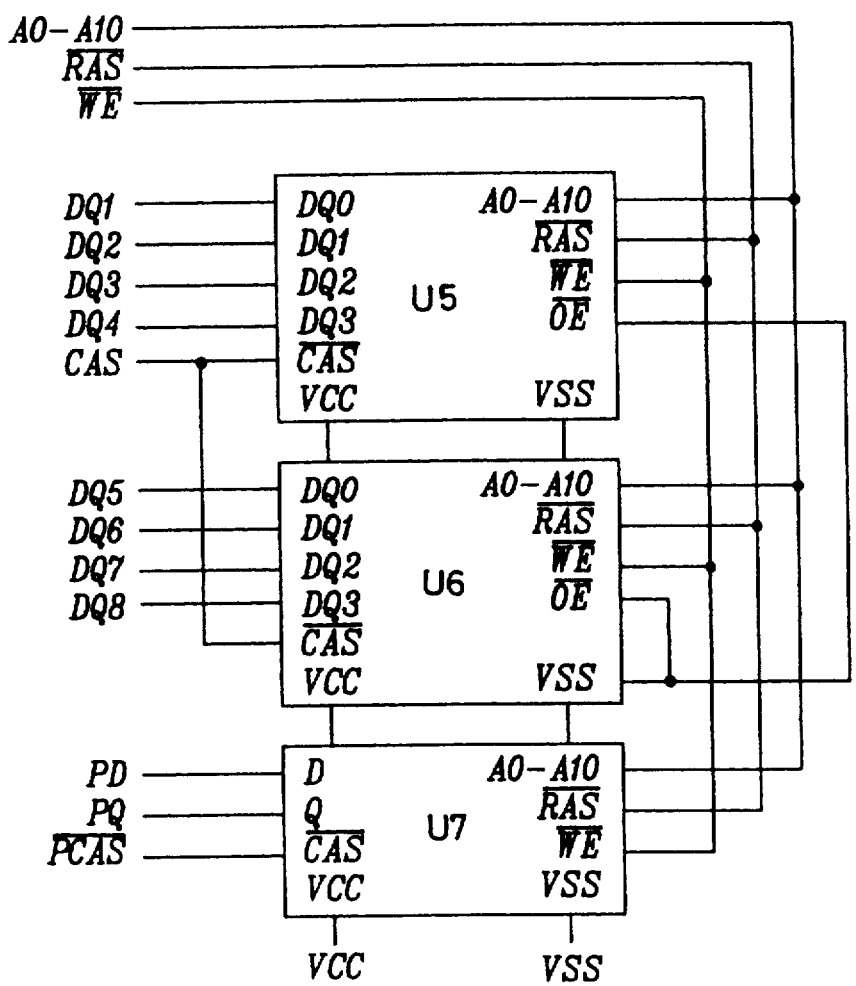
FIG. 22 is a function block diagram of the overall circuit of the stacked multi-package of FIG. 21.

FIG. 21 is a cross-sectional view of a variant of the stacked multi-package of FIG. 19, and FIG. 22 is a functional block diagram of the overall circuit of the stacked multi-package of FIG. 21.

With reference now to FIG. 21, the stacked multi-package (290) has the same structure as that of the multi-package of FIG. 19, except the number of individual packages is three for the multi-package of FIG. 21, while the number is four for the multi-package of FIG. 19.

A 4M×9 SIMM may be constructed of a stacked multi-package (290) having three individual 32 SOJ packages stacked over one another. Outer leads (291) of individual package are fitted to inner leads (292) of the base lead frame, and outer leads (293) of the base lead frame are formed so as to be adequately accommodated for mounting of the package (290) on a printed circuit board.

As can be seen from the function block diagram of FIG. 22, the stacked multi-package (290) has three semiconductor devices (U5, U6, U7) interconnected to each other in series, constituting a 4M×9 DRAM.

Thus, address pins (A0–A10), row address strobe bar pins (RAS), write enable bar pins (WE), out enable bar pins (OE), power supply terminal (VCC), and device operation power supply terminal (VSS) are respectively connected to corresponding pins. Data (DQ1–DQ4, DQ5–DQ8) are inputted and outputted via data lines (DQ1–DQ3) of the semiconductor devices (U5, U6), and data (DP, DQ) are inputted and outputted via data lines (D, Q) of the semiconductor device (U7).

Out enable bar (OE) terminals are connected to device operation power supply terminal (VSS), and data of the devices (U5, U6) are controlled by column address strobe (CAS), while the device (U7) is controlled by parity bit address strobe bar (PCAS) as a parity bit check function device.

Figure 23:
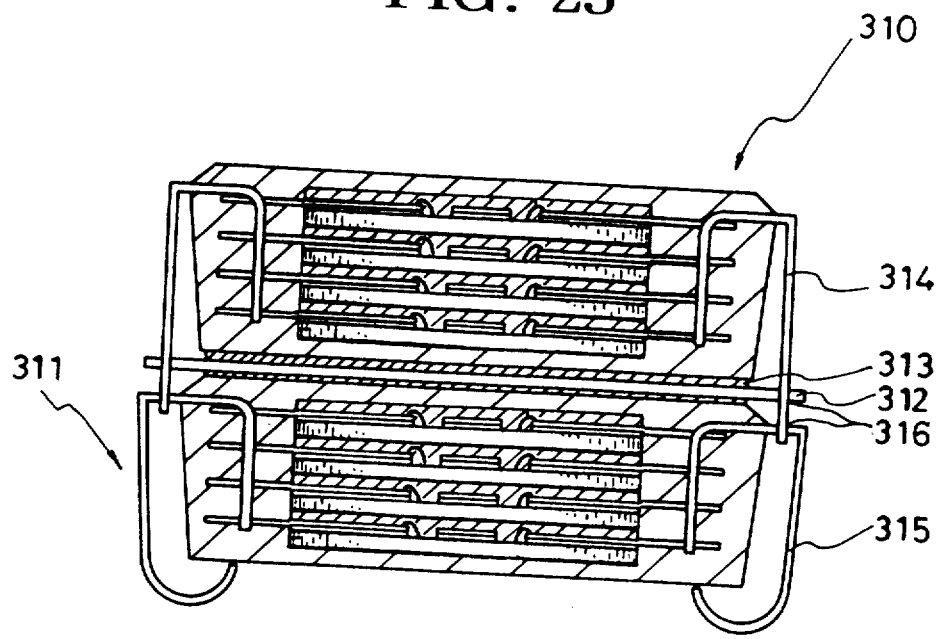
FIG. 23 is a cross-sectional view of a dual package, in which two individual stacked multi-packages of FIG. 14 are mounted on both surfaces of a lead frame.

FIG. 23 shows another embodiment of stacked multi-chip package according to the present invention, in which two stacked multi-packages of FIG. 14 are attached to the upper and lower surfaces of a single lead frame.

With reference to FIG. 23, for the stacked multi-package, two identical individual multi-packages (310, 311) are attached to upper and lower surfaces of a single lead frame (312). In more detail, a lead frame (312) is attached onto a lower individual multi-package (311), which has the same structure as that of the package (210) of FIG. 14, by way of a dual adhesive tape (313), and an upper individual multi-package (310), which is attached to upper surface of the lead frame (312) by way of a dual adhesive tape (313), is stacked on the lower individual multi-package (310) by passing its outer leads (314) through the through holes (316) formed on both ends of the lead frame (312) and then fitting them to the outer leads (315) of the lower multi-package (311). The lead frame (312) is constructed of leads supported by adhesive tapes (313).

Figure 24:
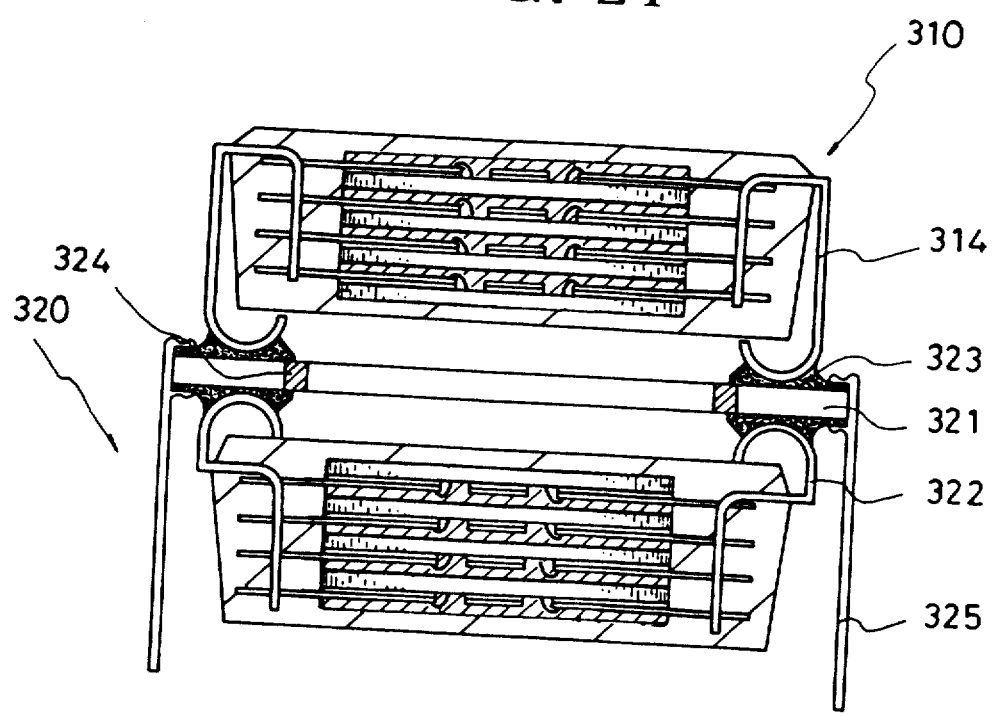
FIG. 24 is a cross-sectional view of a dual package, in which the individual stacked multi-packages of FIG. 14 and of FIG. 13 are mounted on both surfaces of a substrate.

FIG. 24 shows another embodiment of stacked multi-chip package according to the present invention, in which stacked multi-packages of FIG. 14 and of FIG. 13 are attached to the upper and lower surface of a single substrate, respectively.

With reference to FIG. 24, for the stacked multi-package, one individual multi-package (310) of FIG. 14 and one individual multi-package (320) are respectively attached to the upper and lower surfaces of a single substrate (321). In more detail, upper individual multi-package (310), which has the same structure as that of the package (210) of FIG. 14, is mounted onto the upper surface of the substrate (321) such as a printed circuit board by soldering (323) outer leads (314) thereof to the upper surface of the PCB (321), and lower individual multi-package (320), which has the same structure as that of the package (200) of FIG. 13, is bonded beneath the PCB (321) by soldering (323) its outer leads (322) to the lower surface of the PCB (321). The upper package (310) and lower package (320) are electrically interconnected to each other by way of through holes (324) formed on the PCB (321). Pin-shaped lead frames (325), which are electrically connected to solder (323) of both surfaces of the PCB, support the entire package body.

Figure 25:
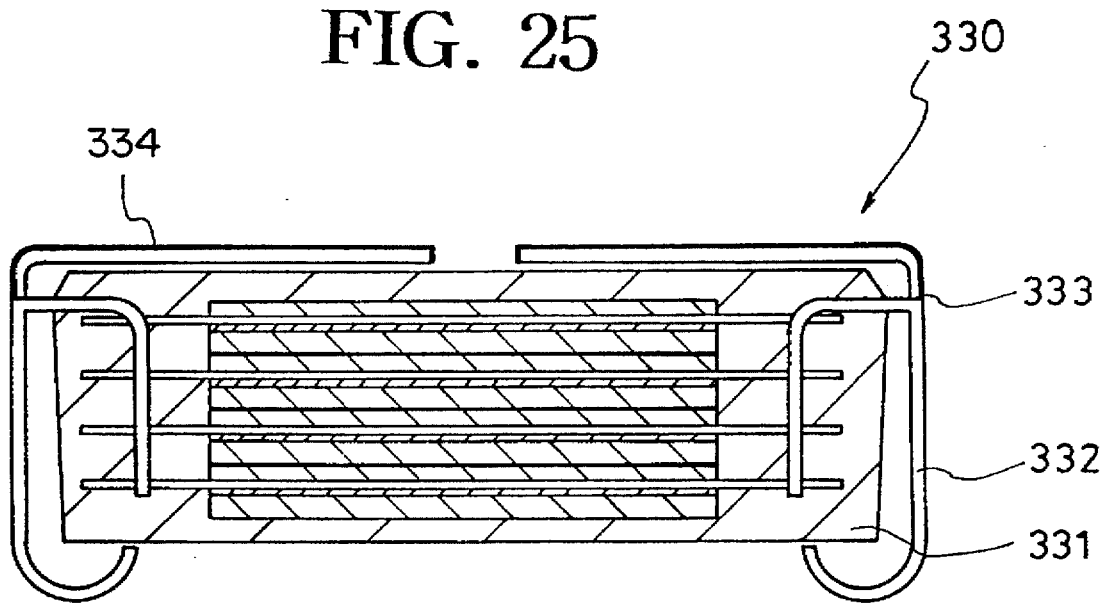
FIG. 25 is a cross-sectional view of the stacked multi-package provided with a heat sink.
Figure 26:
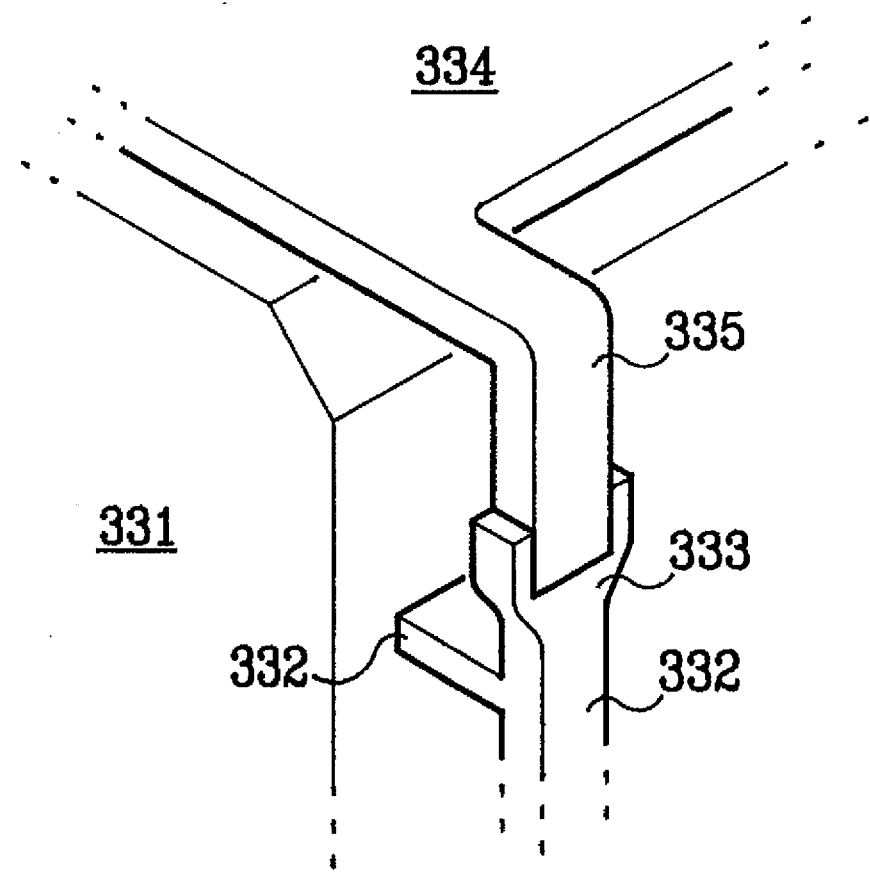
FIG. 26 is a detailed partial perspective view showing the connection between the heat sink and outer lead of the package of FIG. 25.

FIG. 25 is a cross-sectional view of the stacked multi-package provided with a heat sink, and FIG. 26 is a detailed partial perspective view showing the connection between a heat sink and an outer lead of the package of FIG. 25.

With reference to FIGS. 25 and 26, the stacked multi-package (330) has a structure that heat sinks (334) for dissipating heat are placed onto an entire package body (331) and joined to joint area (333) of outer leads (332) of the package (330) via solder (not shown). The package body (331) has the same structure as that of the package (210) of FIG. 14.

Heat sinks (334) are joined to the joint area (333) of the outer leads (332) by fitting their projection (335), which is bent downwardly, into groove of the joint area (333) of the outer leads (332) and then soldering the joint therebetween.

When heat sinks (334) are connected to device operation power supply terminals (VSS) or power supply terminal (VCC), the internal power supply can be stabilized.

Accordingly, the stacked multi-package according to the present invention, in which individual packages having two chips mounted onto upper and lower surfaces of a single printed circuit board are stacked over one another, and plated through holes formed on the printed circuit board are connected to inner leads of a base lead frame to form a single entire stacked multi-package body, enabling an increase in mounting density.

Further, the stacked multi-package according to the present invention, in which outer leads of individual packages are connected to inner leads of a base lead frame for an entire stacked multi-package by way of their special structure, makes it possible to replace a failed individual package prior to molding.

Further, according to the present invention, since individual packages are mounted on upper and lower surfaces of a single printed circuit board or lead frame, the mounting density can be significantly increased.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A semiconductor multi-package stack, comprising:
    a plurality of individual semiconductor chip packages;
    each individual semiconductor chip package including a substrate having an upper surface and a lower surface; said substrate being provided with a plurality of bonding pads; at least one semiconductor chip attached on each said surface; each semiconductor chip having electrode pads; wires electrically connecting respective of the electrode pads of each semiconductor chip to respective of said bonding pads of said substrate;
    a padless lead frame having an upper surface and a lower surface;
    said individual semiconductor chip packages being arranged in a single stack which also includes said padless lead frame as respective stack members; all of said semiconductor chip packages in said single stack facing a same direction; and all of said individual semiconductor chip packages being electrically connected to said padless lead frame; and
    means physically securing adjoining upper and lower surfaces of said stack members to one another.

2. The semiconductor multi-package stack of claim 1, wherein:
    said padless lead frame is incorporated in said stack between two of said individual semiconductor chip packages; and
    said means physically securing said two of said individual semiconductor chip packages to said padless lead frame is solder.

3. The semiconductor multi-package stack of claim 1, wherein:
    all of said individual semiconductor chip packages are substantially identical to one another.

4. The semiconductor multi-package stack of claim 1, wherein:
    said means physically securing adjoining upper and lower surfaces of said individual semiconductor chip packages to one another are bumps.

5. A semiconductor multi-package stack, comprising:
    a plurality of individual semiconductor chip packages;
    each individual semiconductor chip package including a lead frame having an upper surface and a lower surface and having inner and outer leads; a semiconductor chip provided with a plurality of electrode pads; said semiconductor chip being adhered by a layer of adhesive facewise onto a respective one said surface of said lead frame; means electrically connecting respective of said inner leads to respective of said electrode pads;
    said individual semiconductor chip packages being arranged in a single stack as stack members;
    all of said semiconductor chip packages in said single stack facing a same direction;
    a single base lead frame having a plurality of inner leads and outer leads, said inner leads of said single base lead frame being electrically connected to respective outer leads of each said individual semiconductor chip package lead frame; and
    a molding compound encapsulating said stack members and said single base lead frame except for said outer leads of said single base lead frame.

6. The semiconductor multi-package stack of claim 5, wherein:
    all of said semiconductor chips face downwards, towards said outer leads of said single base lead frame.

7. The semiconductor multi-package stack of claim 5, wherein:
    said inner leads of said single base lead frame are T-shaped.

8. The semiconductor multi-package stack of claim 5, further including:
    at least one heat sink joined to at lest one of said outer leads of said single base lead frame.

9. The semiconductor multi-chip package stack of claim 5, wherein:
    said inner leads of said single base lead frame and said outer leads of said individual semiconductor chip package lead frames having complementary interfitting shapes.

10. A dual semiconductor multi-package stack, comprising:
    two semiconductor multi-package stacks, each comprising:
        a plurality of individual semiconductor chip packages;
        each individual semiconductor chip package including a lead frame having an upper surface and a lower surface and having inner and outer leads; a semiconductor chip provided with a plurality of electrode pads; said semiconductor chip being adhered by a layer of adhesive facewise onto a respective one said surface of said lead frame; means electrically connecting respective of said inner leads to respective of said electrode pads;
        said individual semiconductor chip packages being arranged in a single stack as stack members;
        all of said semiconductor chip packages in said single stack facing a same direction;
        a single base lead frame having a plurality of inner leads and outer leads said inner leads of said single base lead frame being electrically connected to respective outer leads of each said individual semiconductor chip package lead frame; and
        a molding compound encapsulating said stack members and said single base lead frame except for said outer leads of said single base lead frame;
    said two semiconductor multi-package stacks being stacked on one another to provide a single stack thereof; and
    means electrically connecting respective outer leads of said single base lead frames of said two semiconductor multi-package stacks.

11. A semiconductor multi-package stack, comprising:
    a plurality of individual semiconductor chip packages;
    each individual semiconductor chip package including a substrate having an upper surface and a lower surface; said substrate being provided with a plurality of bonding pads on said upper surface, a plurality of wire bonding holes and a plurality of plated through holes; at least one semiconductor chip attached on said lower surface; each semiconductor chip having electrode pads; wires passing through said wire bonding holes and connecting respective of the electrode pads of each semiconductor chip to respective of said bonding pads of said substrate;

a base lead frame having inner leads and outer leads;

said individual semiconductor chip packages being arranged in a single stack which also includes said base lead frame as respective stack members; and said inner leads of said base lead frame extending through respective of said plated through holes of said individual semiconductor chip packages and thereby electrically connecting with said individual semiconductor chip packages.

12. A dual semiconductor multi-package stack, comprising:

two semiconductor multi-package stacks, each comprising:

a plurality of individual semiconductor chip packages; each individual semiconductor chip package including a substrate having an upper surface and a lower surface; said substrate being provided with a plurality of bonding pads on said upper surface, a plurality of wire bonding holes and a plurality of plated through holes; at least one semiconductor chip attached on said lower surface; each semiconductor chip having electrode pads; wires passing through said wire bonding holes and connecting respective of the electrode pads of each semiconductor chip to respective of said bonding pads of said substrate;

a base lead frame having inner leads and outer leads;

said individual semiconductor chip packages being arranged in a single stack which also includes said base lead frame as respective stack members; and said inner leads of said base lead frame extending through respective of said plated through holes of said individual semiconductor chip packages and thereby electrically connecting with said individual semiconductor chip packages;

said two semiconductor multi-package stacks being stacked on one another to provide a single stack thereof;

a structure incorporated in said single stack between said two semiconductor multi-package stacks; said structure having two opposite surfaces and through holes between said two opposite surfaces; and respective of said outer leads of said base lead frames being electrically interconnected via said through holes.

13. The dual semiconductor multi-package stack of claim 12, further including:

two layers of adhesive respectively provided on said opposite surfaces of said structure, and adhering respective of said semiconductor multi-package stacks to said structure.

14. The dual semiconductor multi-package stack of claim 12, wherein:

said structure is a lead frame.

* * * * *

UNITED STATES PATENT AND TRADEMARK OFFICE
CERTIFICATE OF CORRECTION

PATENT NO. : 5,677,569

DATED : December 14, 1997

INVENTOR(S) : Choi, et. al.

It is certified that error appears in the above-identified patent and that said Letters Patent is hereby corrected as shown below:

Add Figures 16A, 16B and 16C, after Figures 14 and 15, and before Figures 17A and 18, as shown the attached pages.

Add Figures 21, 22, 23, and 24, after Figure 20, and before Figures 25 and 26, as shown on the attached pages.

Signed and Sealed this

Fourteenth Day of July, 1998

*Attest:*

BRUCE LEHMAN

*Attesting Officer*     *Commissioner of Patents and Trademarks*